United States Patent
Saiki et al.

(10) Patent No.: US 8,805,556 B2
(45) Date of Patent: Aug. 12, 2014

(54) DAMPING APPARATUS AND EXPOSURE APPARATUS

(75) Inventors: Kazuaki Saiki, Yokahama (JP); Ping-Wei Chang, San Jose, CA (US)

(73) Assignee: Nikon Corporation, Tokyo (JP)

( * ) Notice: Subject to any disclaimer, the term of this patent is extended or adjusted under 35 U.S.C. 154(b) by 919 days.

(21) Appl. No.: 12/495,915

(22) Filed: Jul. 1, 2009

(65) Prior Publication Data

US 2010/0001168 A1    Jan. 7, 2010

Related U.S. Application Data

(60) Provisional application No. 61/078,200, filed on Jul. 3, 2008.

(51) Int. Cl.
*G05B 19/18* (2006.01)

(52) U.S. Cl.
USPC ................. 700/60; 700/275; 700/29; 355/72; 355/75

(58) Field of Classification Search
USPC ........... 248/550, 638; 73/662; 355/53, 72, 75; 700/29, 60, 275, 280
See application file for complete search history.

(56) References Cited

U.S. PATENT DOCUMENTS

| | | | | |
|---|---|---|---|---|
| 5,812,420 A * | 9/1998 | Takahashi | ...... | 700/280 |
| 6,202,492 B1 * | 3/2001 | Ohsaki | ...... | 73/662 |
| 6,260,282 B1 * | 7/2001 | Yuan et al. | ...... | 33/1 M |
| 7,280,185 B2 * | 10/2007 | Korenaga | ...... | 355/72 |
| 8,019,448 B2 * | 9/2011 | Nakajima et al. | ...... | 700/60 |
| 2004/0119964 A1 * | 6/2004 | Poon et al. | ...... | 355/72 |
| 2010/0222898 A1 * | 9/2010 | Yang | ...... | 700/29 |

FOREIGN PATENT DOCUMENTS

JP    H11-251410 A    9/1999

* cited by examiner

*Primary Examiner* — Todd M Epps
(74) *Attorney, Agent, or Firm* — Roeder & Broder LLP

(57) ABSTRACT

A damping apparatus that supports and dampens a stage apparatus that positions and drives a stage to a target position is provided herein. The damping apparatus including a support plate part, a support force generating means, and a first controlling means. The support plate part supports the stage apparatus. The support force generating means exerts a damping action by applying a support force to the support plate part in the vertical directions. The first controlling means uses the acceleration of the stage, which is derived from a target track, to the target position, to control the support force generated by the support force generating means so as to compensate for forces that both occur as a result of the acceleration of the stage and cause the support plate part to tilt. The present invention controls vibration and the tilt of a base plate with high precision.

18 Claims, 5 Drawing Sheets

DAMPING APPARATUS AND EXPOSURE APPARATUS

RELATED INVENTIONS

This application claims priority on U.S. Provisional Application Ser. No. 61/078,200, filed Jul. 3, 2008 and entitled "LITHOGRAPHY MACHINE PLATFORM CONTROL METHOD TO REDUCE STAGE MOTION AND WEIGHT INDUCED DEFORMATION". As far as permitted, the contents of U.S. Provisional Application Ser. No. 61/078,200 are incorporated herein by reference.

FIELD OF THE INVENTION

The present invention relates to a damping apparatus that dampens a positioning stage, and an exposure apparatus that uses the damping apparatus.

BACKGROUND

An exposure apparatus that exposes a semiconductor substrate with a circuit pattern, which is formed in a mask, uses a stage apparatus to position the mask and the semiconductor substrate. Advances in circuit miniaturization have brought about an increasing demand for greater positioning performance of the stage apparatus. Typically, the stage apparatus is mounted on a base plate, which is a mechanism that prevents the transmission of vibrations from, for example, the floor to the stage; furthermore, actuators are used both to prevent vibration of the base plate and to correct any tilt of the base plate and the stage that results from the off-centered load that is applied to the base plate based on the position of the stage thereon; thereby the attitude of the base plate is controlled.

With regard to a damping apparatus that uses actuators to control vibration as well as the tilt of the base plate, the conventionally adopted method measures the position of the base plate relative to the floor with a position sensor and performs feedback control to maintain zero displacement between the floor and the base plate. Nevertheless, the conventional controlling method cannot control either the vibration or the tilt of the base plate with sufficient accuracy, and, as a result, the positioning accuracy of the stage cannot be improved using such a method.

The present invention considers the abovementioned points, and it is an object of the present invention to provide a damping apparatus capable of controlling both the vibration and the tilt of a base plate with high accuracy, and an exposure apparatus that uses the damping apparatus.

SUMMARY

The present invention solves the abovementioned problems, is a damping apparatus that supports and dampens a stage apparatus, which positions and drives a stage to a target position, and comprises: a support plate part that supports the stage apparatus; a support force generating means that exerts a damping action by applying a support force to the support plate part in the vertical directions; and a first controlling means that, based on the acceleration of the stage, which is derived from the target track, to the target position, controls the support force generated by the support force generating means so as to compensate for forces that both occur as a result of the acceleration of the stage and cause the support plate part to tilt.

According to this configuration, performing feedforward control, based on the stage's acceleration as derived from the target track of the stage to be positioned, makes it possible to perform control with good accuracy so that the support plate part (the base plate) does not tilt.

In addition, in the abovementioned damping apparatus, the first controlling means controls the support force generated by the support force generating means so that torsional deformation does not occur in the support plate part.

According to this configuration, it is possible to prevent torsion from occurring in the support plate part.

In addition, the abovementioned damping apparatus comprises: a first position detecting means that detects the position of the support plate part in the vertical directions at a plurality of locations; a first deriving means that derives the center of gravity position, the inclination angle, and the amount of torsion of the support plate part based on its position at a plurality of locations as detected by the first position detecting means; and a second controlling means that, based on the center of gravity position, the inclination angle, and the amount of torsion derived by the first deriving means, controls the support force generated by the support force generating means so that inclination and torsional deformation do not occur in the support plate part.

According to this configuration, it is possible to control the support plate part with greater accuracy by detecting the inclination and the torsion of the same and by adding feedback control so that inclination and torsion do not occur in the support plate part.

In addition, the abovementioned damping apparatus comprises: a second position detecting means that detects the position of a structure, which is provided on the stage, at a plurality of locations; a second deriving means that derives the amount of torsion of the structure based on the position at a plurality of locations detected by the second position detecting means; and a third controlling means that controls the support force generated by the support force generating means so that the amount of torsion derived by the second deriving means is zeroed.

According to this configuration, it is possible to perform control so that torsion does not occur in the structure on the stage. The structure on the stage is, for example, a lens that is used in an optical system of an exposure apparatus, which ultimately makes it possible to perform exposures with good accuracy.

In addition, the abovementioned damping apparatus comprises: a fourth controlling means that, based on the position of the stage, which is derived from the target track, to the target position, controls the support force generated by the support force generating means so that the stage does not tilt.

According to this configuration, it is possible to ensure that the stage does not tilt by performing feedforward control based on the position of the stage as derived from the target track of the stage to be positioned. According to the present invention, it is possible to control the vibration and the tilt of the base plate with high accuracy.

DESCRIPTION

Figure 1:
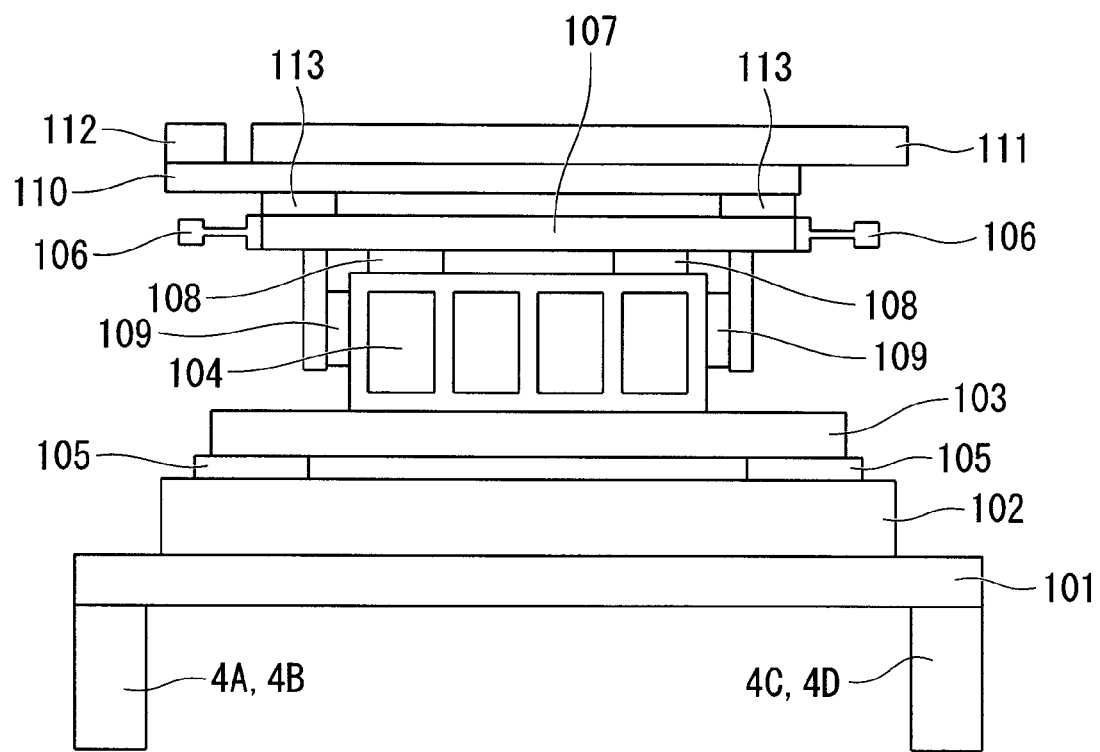
FIG. 1 is a schematic block diagram of a damping apparatus and a stage apparatus, which is installed on the damping apparatus, according to one embodiment of the present invention.

FIG. 1 is a schematic block diagram of a damping apparatus and a stage apparatus, which is installed on the damping apparatus, according to one embodiment of the present invention.

In FIG. 1, the damping apparatus comprises a base plate 101 and four mounts (leg parts) 4A, 4B, 4C, 4D, which are provided to the four corners, respectively, of the base plate 101 and support such on the floor surface. Each of the mounts 4A-4D is an air spring type support mechanism and holds the base plate 101 at a prescribed height above the floor surface. In addition, the pressure of the air spring of each of the mounts 4A-4D can be controlled independent of that of the other mounts; furthermore, applying an appropriate pressure to the air spring of each of the mounts 4A-4D in accordance with the state of the stage apparatus—e.g., the position and acceleration of a plate table 110 within a horizontal plane—makes it possible to maintain the base plate 101 in a horizontal state and to ensure that vibrations from the floor surface are not transmitted thereto.

In FIG. 1, the stage apparatus, which is configured as described below, is installed on the upper surface of the base plate 101. Namely, two X axis guides 102 (of the two, only the one on the near side is shown in the figure), which extend in the X directions, are laid parallel to each other on the upper surface of the base plate 101 so that they are spaced apart in the Y directions, and X carriages 103 are movably provided so that they straddle both of the side parts and the upper part of each of the X axis guides 102. A Y axis guide 104, which extends in the Y directions (those directions perpendicular to the paper surface), is securely fixed to the upper parts of the X carriages 103; furthermore, the Y axis guide 104 has a bridge-like suspension and connects the two X carriages 103. A plurality of air bearings 105 is disposed between the X carriages 103 and the X axis guides 102. The air bearings 105 are fixed to the X carriages 103; furthermore, the X carriages 103 and the Y axis guide 104 (in the explanation below, these two elements are collectively called an X stage for the sake of convenience) are noncontactually supported so that they float on the X axis guides 102, are guided by the X axis guides 102, and are configured movably in the X directions.

A Y carriage 107 is mounted to the upper part of the Y axis guide 104. A plurality of air bearings 108 (base bearings) is disposed between the Y carriage 107 and the upper surface of the Y axis guide 104, and a plurality of air bearings 109 (side bearings) is disposed between the Y carriage 107 and both side surfaces of the Y axis guide 104. The air bearings 109 are attached to the Y carriage 107 in the state wherein the air bearings 109 may move in the θ directions. All of the air bearings 108, 109 are fixed to the Y carriage 107; in addition, the Y carriage 107 (in the explanation below, called the Y stage for the sake of convenience), which is supported non-contactually so that it floats on the Y axis guide 104, is guided by the Y axis guide 104, and is configured movably in the Y directions and the θ directions.

The plate table 110 is supported rotatably in the θ directions—rotational directions wherein the Z axis, which is perpendicular to the X and Y axes, is the rotational axis—on the Y carriage 107 by a plurality of air bearings 113. A plate holder 111, which vacuum chucks a glass substrate and the like, and a position sensor 112, which is used for positional measurement, are provided on the plate table 110. The position sensor 112 is, for example, a movable mirror that constitutes part of an interferometric measuring instrument (a laser interferometer); in addition, a laser beam from a light source that is provided externally (above the base plate 101) is radiated as a measuring beam to the movable mirror, is reflected thereby, and so is caused to interfere with a reference beam inside the abovementioned interferometric measuring instrument; thereby the position of the plate holder 111 is measured precisely using the base plate 101 as a reference.

An X linear motor (not shown) is provided on each of both end parts (the near side and the far side of the paper surface) of the Y axis guide 104, and the drive of these X linear motors moves a structure, which is mounted to the X carriages 103, along the X axis guides 102 in the X directions. In addition, a Y linear motor 106 is provided to each side surface part of the Y carriage 107, and the drive of the Y linear motors 106 moves the structure that is mounted to the Y carriage 107 along the Y axis guide 104 in the Y directions. Furthermore, in FIG. 1, while the movers of the Y linear motors 106 are shown, the stators are not. The stators may be provided to the X carriages 103, but may also be provided to some other members. In addition, the drive of a θ linear motor (not shown) rotates the plate table 110 in the θ directions. Alternatively, creating differences in the magnitude of the thrusts generated by the left and right Y linear motors 106 may also rotate the plate table 110 in the θ directions.

Figure 2:
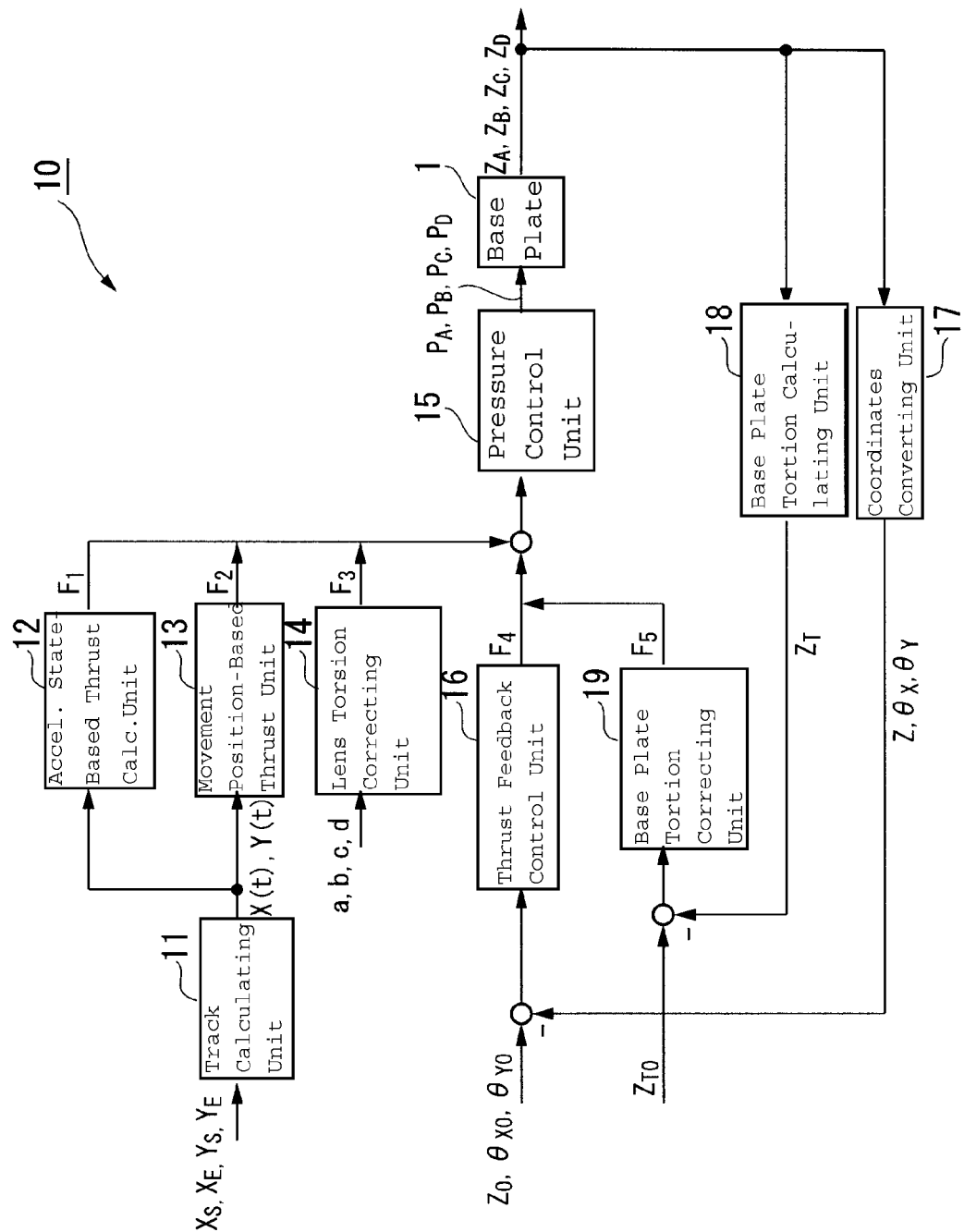
FIG. 2 is a block diagram that shows the configuration of a control system of the damping apparatus.

FIG. 2 is a block diagram that shows the configuration of a control system of the above mentioned damping apparatus. In FIG. 2, a damping apparatus 10 comprises: a track calculating unit 11; an acceleration state-based thrust calculating unit 12; a movement position-based thrust calculating unit 13; a lens torsion correcting unit 14; a pressure control unit 15; a thrust feedback control unit 16; a coordinates converting unit 17; a base plate torsion calculating unit 18; and a base plate torsion correcting unit 19.

The track calculating unit 11 inputs X coordinates $X_S$, $X_E$ of an operation start point and an operation end point, which are used to track and control the X stage, and Y coordinates $Y_S$, $Y_E$ of an operation start point and an operation end point, which are used to track and control the Y stage. The track calculating unit 11 calculates a target track for tracking and controlling each of the stages (the X stage and the Y stage) based on the operation start points and operation end points, in other words, the inputted X coordinates $X_S$, $X_E$ and the inputted Y coordinates $Y_S$, $Y_E$. The target track is represented by time series data for the X stage position X(t) and the Y stage position Y(t) associated with time t. The target track may be set arbitrarily in accordance with the required positioning performance (e.g., gradual or sharp acceleration).

The acceleration state-based thrust calculating unit 12 first calculates, based on the target track calculated by the track calculating unit 11, the acceleration X" (X directions) of the X stage and the acceleration Y" (Y directions) of the Y stage. The acceleration X" and the acceleration Y" can be derived by double differentiating the positional coordinates of the target track with respect to time. The acceleration state-based thrust calculating unit 12 next uses equations (8), (6-1), and (6-2) (discussed later) to calculate, based on the accelerations X", Y", a thrust instruction value F1 that is applied to each of the mounts 4A, 4B, 4C, 4D to cancel the forces that cause the base plate 101 to tilt, which occurs as a result of the accelerative drive of the stages. Furthermore, the symbol " in the text of the present specification means the second derivative with respect to time.

The movement position-based thrust calculating unit 13 substitutes the positional coordinates of the target track, which are calculated by the track calculating unit 11, in equations (1-1)-(1-4) (discussed later) to calculate a thrust instruction value F2 that is needed to cause each of the mounts 4A, 4B, 4C, 4D to generate a prescribed thrust for canceling the forces that tend to tilt the base plate 101. The forces that tend to tilt the base plate 101 occur because the positions of the X stage and the Y stage, in both their moving and stationary states, are shifted from the center of the base plate 101.

The lens torsion correcting unit 14 calculates a thrust instruction value F3 that is applied to each of the mounts 4A, 4B, 4C, 4D to correct torsion of a lens, which occurs when the lens is mounted to the base plate 101 via a prescribed support mechanism. If the stage apparatus and the damping apparatus of the present embodiment are adapted to an exposure apparatus in FIG. 6 (discussed later), then the lens (not shown in FIG. 1) may be considered part of the optical system for performing exposures. The base plate 101 is provided with a laser interferometer (not shown in FIG. 1) that measures the precise position thereof in order to detect torsion of the lens, and the lens torsion correcting unit 14 inputs position measurement values a, b, c, d, which the laser interferometer measures at multiple locations of the lens. The lens torsion correcting unit 14 uses equation (14) (discussed later) to calculate the thrust instruction value F3 based on the inputted measurement positions a, b, c, d.

The pressure control unit 15 controls the thrust (which is proportional to the pressure of the air spring) in the Z directions (the height direction) that is generated by each of the mounts 4A-4D in accordance with a total thrust instruction value, which is the sum of the following: the thrust instruction value F1, calculated by the acceleration state-based thrust calculating unit 12; the thrust instruction value F2, calculated by the movement position-based thrust calculating unit 13; the thrust instruction value F3, calculated by the lens torsion correcting unit 14; the thrust instruction value F4, calculated by the thrust feedback control unit 16; and the thrust instruction value F5, calculated by the base plate torsion correcting unit 19. The base plate 101 is held in place by the aggregate of the thrusts F1-F5.

Here, in order to detect the attitude of the base plate 101, the mounts 4A-4D are provided with position sensors (not shown in FIG. 1), one position sensor for each mount, that detect the displacements $Z_A$, $Z_B$, $Z_C$, $Z_D$ thereof in the Z directions. The coordinates converting unit 17 uses equation (9) (discussed later) to transform the displacements $Z_A$, $Z_B$, $Z_C$, $Z_D$, which are detected by the position sensors, of each of the mounts 4A-5D to the following: a center of gravity position Z of the base plate 101 in the Z directions; a rotational angle $\theta_X$ of the base plate 101 around the X axis; and a rotational angle $\theta_Y$ of the base plate 101 around the Y axis.

The thrust feedback control unit 16 inputs the differences between the measurement values Z, $\theta_X$, $\theta_Y$, which the coordinates converting unit 17 outputs, and the respective target reference values $Z_0$, $\theta_{X0}$, $\theta_{Y0}$. The thrust feedback control unit 16 first calculates, based on the differential values for Z, $\theta_X$, $\theta_Y$, the accelerations Z", $\theta_X$", $\theta_Y$" that are needed to ensure that the actual attitude of the base plate 101, i.e., the measurement values Z, $\theta_X$, $\theta_Y$, coincides with the reference values $Z_0$, $\theta_{X0}$, $\theta_{Y0}$. It is possible to perform these calculations using a calculating method based on, for example, PID (proportional-integral-derivative) control. The thrust feedback control unit 16 next uses equation (11) (discussed later) to calculate, based on the accelerations Z", $\theta_X$", $\theta_Y$", the thrust instruction value F4 that is applied to each of the mounts 4A, 4B, 4C, 4D to cause the base plate 101 to undergo these accelerations.

The base plate torsion calculating unit 18 uses equation (12) (discussed later) to calculate the torsion $Z_T$ of the base plate 101 based on the displacements $Z_A$, $Z_B$, $Z_C$, $Z_D$ of the mounts 4A-4D as detected by the position sensors.

The base plate torsion correcting unit 19 inputs the differential between the torsion $Z_T$ of the base plate 101, which is output by the base plate torsion calculating unit 18, and the target reference value $Z_{T0}$ of the torsion $Z_T$. The base plate torsion correcting unit 19 uses equation (13) (discussed later) to calculate, based on the differential values, the thrust instruction value F5, which is applied to each of the mounts 4A, 4B, 4C, 4D to make the torsion $Z_T$ of the base plate 101 coincide with the reference value $Z_{T0}$. It is possible to perform this calculation using a calculating method that is based on, for example, PID (proportional-integral-derivative) control.

Figure 3:
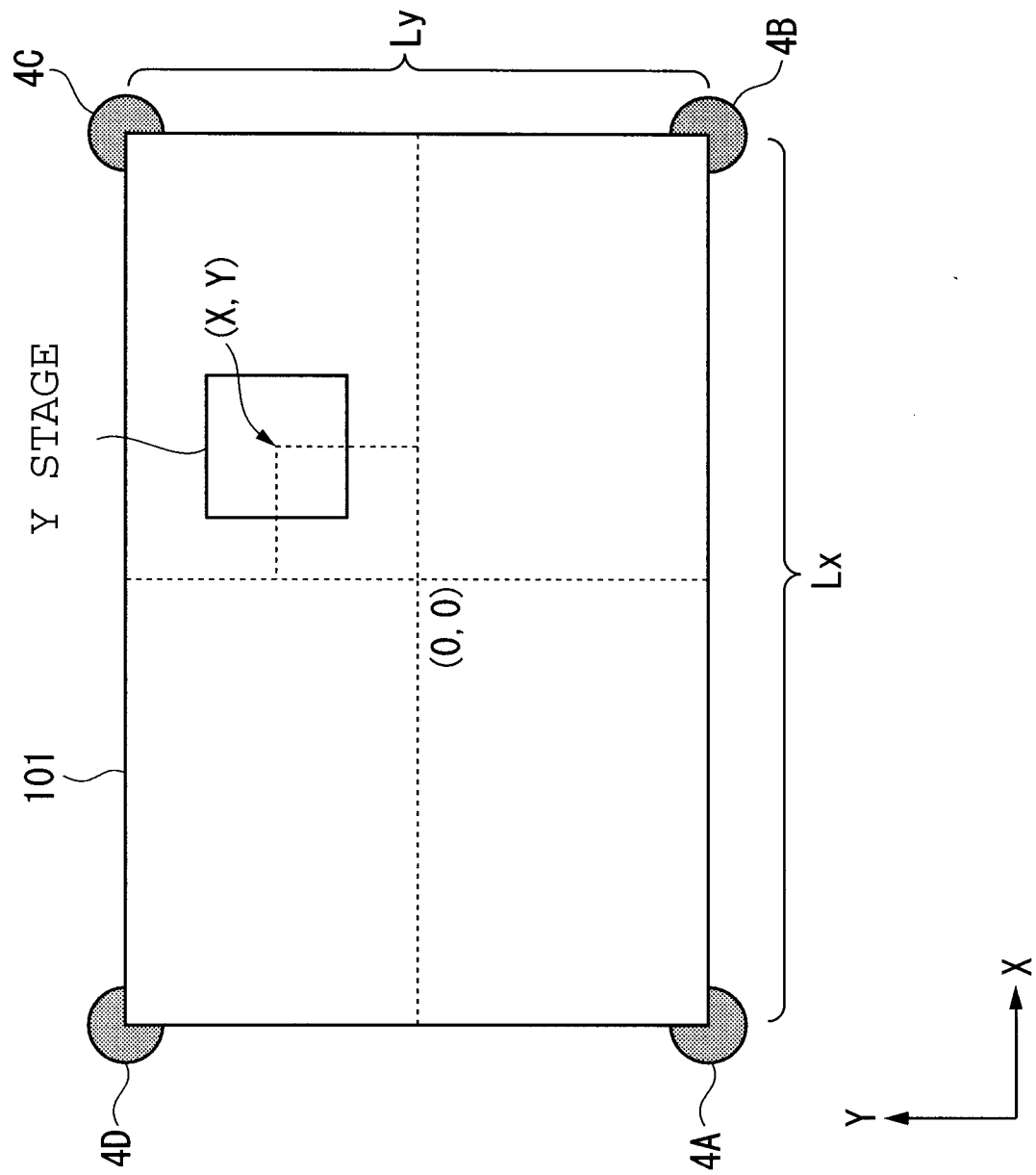
FIG. 3 is a view for explaining the calculating method wherein a movement position-based thrust calculating unit calculates a thrust instruction value F2.

The following explains in detail the controlling method that is implemented by each of the abovementioned parts. FIG. 3 is a view that shows the arrangement of the base plate 101 and the Y stage (the X stage is not shown) and explains the calculating method wherein the movement position-based thrust calculating unit 13 calculates the thrust instruction value F2. If the position of the center of gravity of the Y stage is (X, Y), then the thrust instruction value F2, which is calculated by the movement position-based thrust calculating unit 13 to ensure that the base plate 101 does not tilt when the Y stage shifts from the origin (0, 0), is defined by equations (1-1)-(1-4) below.

Equations 1

$$F_{2A} = \frac{W}{4} - \frac{W}{2L_X}X - \frac{W_Y}{2L_Y}Y + \frac{W_Y}{L_X L_Y}XY \qquad (1\text{-}1)$$

$$F_{2B} = \frac{W}{4} + \frac{W}{2L_X}X - \frac{W_Y}{2L_Y}Y - \frac{W_Y}{L_X L_Y}XY \qquad (1\text{-}2)$$

$$F_{2C} = \frac{W}{4} + \frac{W}{2L_X}X + \frac{W_Y}{2L_Y}Y + \frac{W_Y}{L_X L_Y}XY \qquad (1\text{-}3)$$

$$F_{2D} = \frac{W}{4} - \frac{W}{2L_X}X + \frac{W_Y}{2L_Y}Y - \frac{W_Y}{L_X L_Y}XY \qquad (1\text{-}4)$$

Therein, $F_{2A}$, $F_{2B}$, $F_{2C}$, $F_{2D}$ are thrust instruction values that are applied to the mounts 4A, 4B, 4C, 4D, W is the force that the X stage and the Y stage exert upon the base plate 101 as a result of gravity, $W_Y$ is the force that the Y stage alone exerts on the base plate 101 as a result of gravity, $L_X$ is the distance between mounts in the X directions, and $L_Y$ is the distance between mounts in the Y directions. In addition, the positional coordinates of the target track, which are calculated by the track calculating unit 11, are used as the center of gravity coordinates (X, Y).

The objective for unit 13 is to calculate thrust forces $F_{2A}(t)$, $F_{2B}(t)$, $F_{2C}(t)$, $F_{2D}(t)$ using equations (1-1)-(1-4) given the measured center coordinates X(t) and Y(t) at any given time (t). The parameters W, Wy, Lx, Ly are to remain constant throughout operation. Any inaccuracy in W, Wy, Lx, Ly may thus result in sub-optimal result in the calculation of $F_{2A}(t)$, $F_{2B}(t)$, $F_{2C}(t)$, $F_{2D}(t)$. Such parameter inaccuracy may be due to difficulty in the identification of true center of gravity location. To remedy such situation, we can take advantage of the fact that equations (1-1)-(1-4) should hold true not only when X or Y stages are moving but also when both stages are not moving. When the stage is commanded to stay steady at a given location X(tp)=Xp and Y(tp)=Yp, the association between the steady states of $F_{2A}(tp), F_{2B}(tp), F_{2C}(tp), F_{2D}(tp)$ and the steady states of X(tp), Y(tp) becomes accurately determined, because the four displacement sensors $Z_A, Z_B, Z_C, Z_D$ of the mounts 4A-4D can serve as measurement reference for the determination of wheather steady state has been reached. After we repeat such procedure at least four different locations, the solvability of equations (1-1)-(1-4) becomes mathematically established and the true center of gravity location becomes accurately identified, reflected in the re-adjustment of parameters W, Wy, Lx, Ly.

The air spring pressure instruction values that are applied to the mounts 4A-4D to generate the thrust of the thrust instruction value F2 mentioned above can be expressed by $P_{2A}=F_{2A}/a_A$, $P_{2B}=F_{2B}/a_B$, $P_{2C}=F_{2C}/a_C$, and $P_{2D}=F_{2D}/a_D$, respectively Therein, $a_A, a_B, a_C, a_D$ are the effective bearing surface areas of the mounts 4A-4D, respectively.

Furthermore, the above equations (1-1)-(1-4) can be derived as below.

Namely, the equilibrium equation of the forces of the base plate 101 in the Z directions is defined by equation (2-1) below; the equilibrium equation of the moments around the X axis is defined by equation (2-2) below; and the equilibrium equation of the moments around the Y axis is defined by equation (2-3) below.

Equations 2

$$F_{2A} + F_{2B} + F_{2C} + F_{2D} = W \quad (2\text{-}1)$$

$$W_Y Y + \frac{L_Y}{2}(F_{2A} + F_{2B}) = \frac{L_Y}{2}(F_{2C} + F_{2D}) \quad (2\text{-}2)$$

$$WX + \frac{L_X}{2}(F_{2A} + F_{2D}) = \frac{L_X}{2}(F_{2B} + F_{2C}) \quad (2\text{-}3)$$

If we define $F_{2A}+F_{2B}=F_\alpha$ and $F_{2C}+F_{2D}=F_\beta$ and solve equations (2-1) and (2-2) for $F_\alpha$ and $F_\beta$, we obtain equations (3-1), (3-2) below.

Equations 3

$$F_\alpha = \frac{W}{2} - \frac{W_Y}{L_Y}Y \quad (3\text{-}1)$$

$$F_\beta = \frac{W}{2} + \frac{W_Y}{L_Y}Y \quad (3\text{-}2)$$

At this point, if we establish equilibrium equations of the forces of the base plate 101 only on the mounts 4A, 4B side, then we obtain equations (4-1), (4-2) below. Therein, $W_\alpha$ defines the gravity that the X stage and the Y stage exert on the mounts 4A, 4B side of the base plate 101.

Equations 4

$$F_{2A} + F_{2B} = W_\alpha \quad (4\text{-}1)$$

$$W_\alpha X + \frac{L_X}{2}F_{2A} = \frac{L_X}{2}F_{2B} \quad (4\text{-}2)$$

If we solve the abovementioned equations (4-1), (4-2) for $F_{2A}$ and $F_{2B}$, we obtain equations (5-1), (5-2) below.

Equations 5

$$F_{2A} = \left(\frac{1}{2} - \frac{X}{L_X}\right)W_\alpha \quad (5\text{-}1)$$

$$F_{2B} = \left(\frac{1}{2} + \frac{X}{L_X}\right)W_\alpha \quad (5\text{-}2)$$

Accordingly, based on equations (3-1), (4-1) and the definitions of $W_\alpha$ and $F_\alpha$, we obtain equation (1-1) from the above equation (5-1), and equation (1-2) from the above equation (5-2). Equations (1-3), (1-4) are similarly obtained. The obtained equations (1-1)-(1-4) are correct solutions because they satisfy the relationship of the above equilibrium equation (2-3).

Figures 4A, 4B:
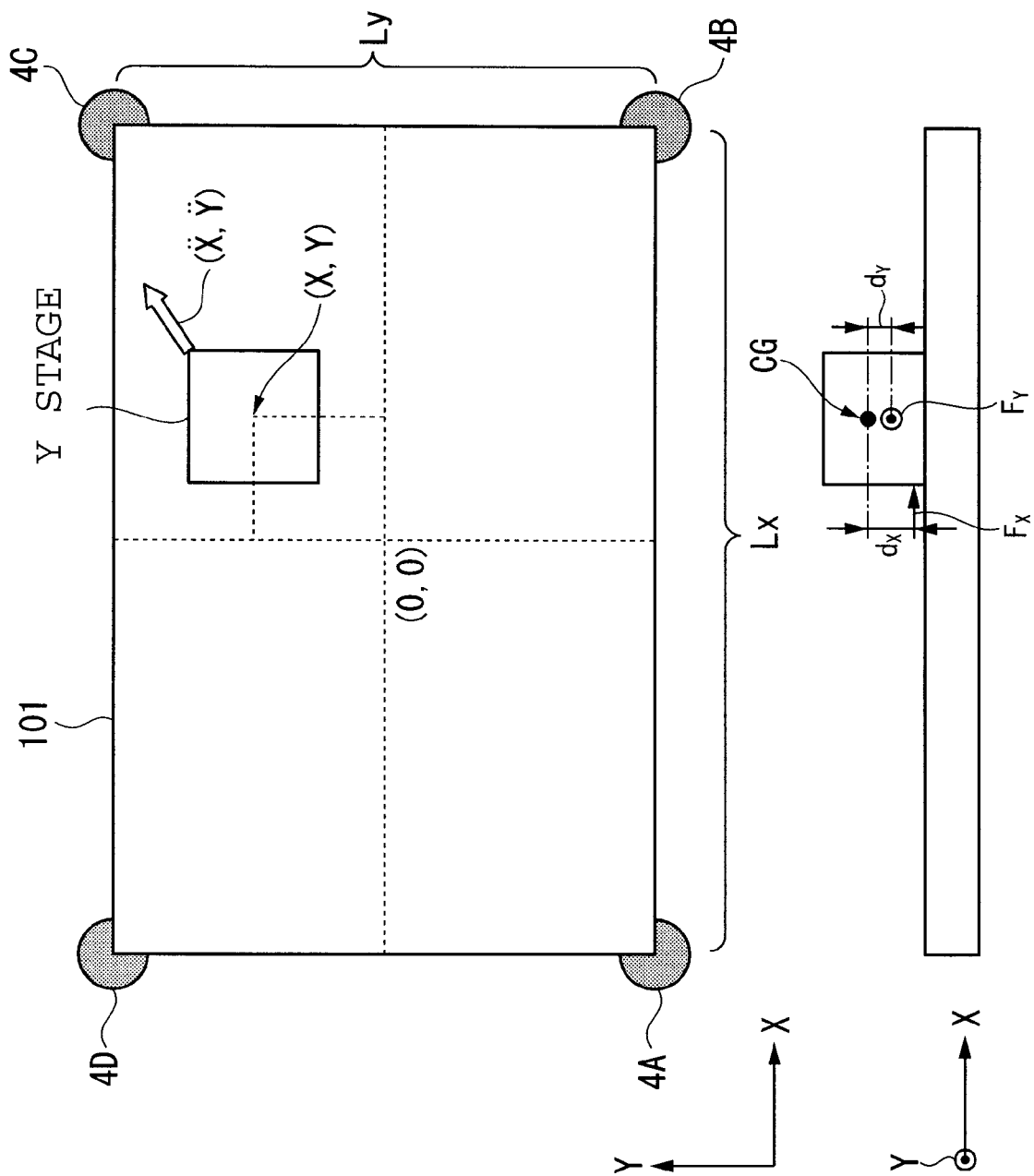
FIGS. 4(A), (B) are views for explaining a calculating method wherein an acceleration state-based thrust calculating unit calculates a thrust instruction value F1.

FIGS. 4(A), (B) are views for explaining the calculating method wherein the acceleration state-based thrust calculating unit 12 calculates the thrust instruction value F1, and shows aspects, a top view in FIG. 4(A) and a side view in FIG. 4(B), wherein the Y stage accelerates and moves toward the base plate 101 (the X stage is not shown). As shown in FIG. 4(B), the point of application of the acceleration force $F_Y$, which acts on the Y stage as a result of the thrusts from the Y linear motors 106 discussed earlier, deviates from a center of gravity $CG_Y$ of the Y stage by a height of $d_Y$. Similarly, the point of application of the acceleration force $F_X$, which acts on an X moving body, wherein the X stage and the Y stage are considered integral, as a result of the thrust from the X linear motors, deviates from a center of gravity $CG_X$ of the X moving body by a height of $d_X$. Thus, because the application points of the acceleration forces deviate from the centers of gravity, when the stage, driven by the motors, accelerates, these acceleration forces cause moments of force around the X and Y axes to act on the base plate 101, which tilts as a result. The moments of force around the X axis $M_X$ and the moments of force around the Y axis $M_Y$ are defined by equations (6-1) and (6-2) below.

Equations 6

$$M_X = -F_X \cdot d_X = -(m_{xy} \cdot X'') \cdot d_X = -(m_{xy} \cdot d_X) \cdot X'' \quad (6\text{-}1)$$

$$M_Y = -F_Y \cdot d_Y = -(m_y \cdot Y'') \cdot d_Y = -(m_y \cdot d_Y) \cdot Y'' \quad (6\text{-}2)$$

Therein, $m_y$ is the mass of the Y stage, $m_{xy}$ is the mass of the X moving body, wherein the X stage and the Y stage are considered integral, and X", Y" are the accelerations of the centers of gravity of the Y stage in the X directions and the Y directions, respectively. The values obtained by double differentiating the Y stage center of gravity coordinates (X, Y), which are determined by the target track positional coordinates, with respect to time are used as the acceleration X" in the X directions and the acceleration Y" in the Y directions.

At this time, the mounts 4A, 4B, 4C, 4D generate thrusts $F_{1A}, F_{1B}, F_{1C}, F_{1D}$, respectively, to the base plate 101, whereon the abovementioned moments of force $M_X, M_Y$ act during acceleration, so that the base plate 101 does not tilt as a result of these moments of force $M_X, M_Y$. The equilibrium equation of the forces that act on the base plate 101 in the Z directions at this time is defined by equation (7-1) below, the equilibrium equation of the moments around the X axis is defined by the equation (7-2) below, the equilibrium equation of the moments around the Y axis is defined by the equation (7-3) below, and the equilibrium equation that must be satisfied to ensure the base plate 101 is not subject to torsion is defined by the equation (7-4) below.

Equations 7

$$F_{1A} + F_{1B} + F_{1C} + F_{1D} = 0 \quad (7\text{-}1)$$

$$\frac{L_X}{2}(F_{1B} + F_{1C}) - \frac{L_X}{2}(F_{1A} + F_{1D}) = M_X \quad (7\text{-}2)$$

$$\frac{L_Y}{2}(F_{1C} + F_{1D}) - \frac{L_Y}{2}(F_{1A} + F_{1B}) = M_Y \quad (7\text{-}3)$$

$$L_X L_Y (F_{1A} + F_{1C}) - L_X L_Y (F_{1B} + F_{1D}) = 0 \quad (7\text{-}4)$$

Solving the above equations (7-1)-(7-4) results in equation (8), which defines the thrust instruction value F1 as calculated by the acceleration state-based thrust calculating unit 12.

Equation 8

$$\begin{bmatrix} F_{1A} \\ F_{1B} \\ F_{1C} \\ F_{1D} \end{bmatrix} = \begin{bmatrix} -\dfrac{M_X}{2L_X} - \dfrac{M_Y}{2L_Y} \\ \dfrac{M_X}{2L_X} - \dfrac{M_Y}{2L_Y} \\ \dfrac{M_X}{2L_X} + \dfrac{M_Y}{2L_Y} \\ -\dfrac{M_X}{2L_X} + \dfrac{M_Y}{2L_Y} \end{bmatrix} \quad (8)$$

As is clear from the process used to derive equation (8), if the mounts 4A-4D generate thrusts in accordance with the thrust instruction value F1 defined above in equation (8), then the base plate 101 will be controlled such that neither tilt nor torsion occur during the acceleration of the Y stage. Furthermore, similar to the case of the thrust instruction value F2 discussed above, the air spring pressure instruction value that is applied to each of the mounts 4A-4D in order to generate the thrust defined by the abovementioned thrust instruction value F1 can be defined so that $P_{1A}=F_{1A}/a_A$, $P_{1B}=F_{1B}/a_B$, $P_{1C}=F_{1C}/a_C$, and $P_{1D}=F_{1D}/a_D$.

The following explains the calculating method wherein the thrust feedback control unit 16 calculates the thrust instruction value F4. Equation (9) below defines the conversion equation that converts the displacements $Z_A$, $Z_B$, $Z_C$, $Z_D$ of the mounts 4A-4D, respectively, as detected by the position sensors to the following: a position Z of the center of gravity of the base plate 101 in the Z directions; a rotational angle $\theta_X$ of the base plate 101 around the X axis; and a rotational angle $\theta_Y$ of the base plate 101 around the Y axis. Therein, ΔX and ΔY are the center of gravity positions—which change when the X stage, the Y stage, or the like move—of the base plate 101 (including the X stage and the Y stage), and the $L_X$, $L_Y$ are the distances in the X directions and the Y directions, respectively, between the position sensors provided to the mounts 4A-4D.

The differentials between the measurement values Z, $\theta_X$, $\theta_Y$ of the center of gravity positions and the rotational angles of the base plate 101 as derived from the abovementioned equation (9) and the corresponding target reference values $Z_0$, $\theta_{X0}$, $\theta_{Y0}$ define the tracking errors for controlling the attitude of the base plate 101. Typical PID control and other techniques can be used to derive the accelerations Z", $\theta_X$", $\theta_Y$" to be applied to the base plate 101, and thereby keep these tracking errors small; in other words, to make the attitude (Z, $\theta_X$, $\theta_Y$) of the base plate 101 approach the state of the reference values. Thrusts $F_{4A}$, $F_{4B}$, $F_{4C}$, $F_{4D}$ are generated from the mounts 4A, 4B, 4C, 4D, respectively, so that the base plate 101 is subject to these derived accelerations Z", $\theta_X$", $\theta_Y$". The equilibrium equation of the forces of the base plate 101 in the Z directions at this time is defined by the equation (10-1) below, the equilibrium equation of the moments around the X axis is defined by the equation (10-2) below, the equilibrium equation of the moments around the Y axis is defined by the equation (10-3) below, and the equilibrium equation that is needed to ensure that the base plate 101 does not undergo torsion is defined by the equation (10-4) below.

Equations 10

$$F_{4A} + F_{4B} + F_{4C} + F_{4D} = m \cdot Z'' \quad (10\text{-}1)$$

$$\frac{L_X}{2}(F_{4B} + F_{4C}) - \frac{L_X}{2}(F_{4A} + F_{4D}) = I_{YY} \cdot \theta_Y'' \quad (10\text{-}2)$$

$$\frac{L_Y}{2}(F_{4C} + F_{4D}) - \frac{L_Y}{2}(F_{4A} + F_{4B}) = I_{XX} \cdot \theta_X'' \quad (10\text{-}3)$$

$$(F_{4A} + F_{4C}) - (F_{4B} + F_{4D}) = \Delta F = 0 \quad (10\text{-}4)$$

Therein, m is the mass of the base plate 101, which includes the X stage and the Y stage, $I_{YY}$ is the rotating moment around the Y axis of the base plate 101, and $I_{XX}$ is the rotating moment around the X axis of the same. In addition, the difference in the forces that operate on the base plate 101 along the two diagonal lines is defined by the torsional force ΔF; here, it is assumed that ΔF=0 so that the base plate 101 is not subject to torsion because of the control performed by the thrust feedback control unit 16. Solving the above equations (10-1)-(10-4) results in equation (11) below, which defines the thrust instruction value F4 calculated by the thrust feedback control unit 16 (here, the second term on the right side of equation (11) is 0 because ΔF=0).

Equation 9

$$\begin{bmatrix} Z \\ \theta_X \\ \theta_Y \end{bmatrix} = \begin{bmatrix} \dfrac{(L_Y - 2\Delta Y)(L_X - 2\Delta X)}{4L_X L_Y} & \dfrac{(L_Y - 2\Delta Y)(L_X + 2\Delta X)}{4L_X L_Y} & \dfrac{(L_Y + 2\Delta Y)(L_X + 2\Delta X)}{4L_X L_Y} & \dfrac{(L_Y + 2\Delta Y)(L_X - 2\Delta X)}{4L_X L_Y} \\ -\dfrac{1}{2 \cdot L_Y} & -\dfrac{1}{2 \cdot L_Y} & \dfrac{1}{2 \cdot L_Y} & \dfrac{1}{2 \cdot L_Y} \\ \dfrac{1}{2 \cdot L_X} & -\dfrac{1}{2 \cdot L_X} & -\dfrac{1}{2 \cdot L_X} & \dfrac{1}{2 \cdot L_X} \end{bmatrix} \begin{bmatrix} Z_A \\ Z_B \\ Z_C \\ Z_D \end{bmatrix} \quad (9)$$

Equation 11

$$\begin{bmatrix} F_{4A} \\ F_{4B} \\ F_{4C} \\ F_{4D} \end{bmatrix} = \begin{bmatrix} \frac{m}{4} & -\frac{I_{XX}}{2L_Y} & -\frac{I_{YY}}{2L_X} \\ \frac{m}{4} & -\frac{I_{XX}}{2L_Y} & \frac{I_{YY}}{2L_X} \\ \frac{m}{4} & \frac{I_{XX}}{2L_Y} & \frac{I_{YY}}{2L_X} \\ \frac{m}{4} & \frac{I_{XX}}{2L_Y} & -\frac{I_{YY}}{2L_X} \end{bmatrix} \begin{bmatrix} Z'' \\ \theta''_X \\ \theta''_Y \end{bmatrix} + \begin{bmatrix} \frac{1}{4} \\ -\frac{1}{4} \\ \frac{1}{4} \\ -\frac{1}{4} \end{bmatrix} \Delta F \quad (11)$$

Thus, if the position sensors measure the positions of the mounts 4A-4D in the Z directions and if the mounts 4A-4D generate thrusts in accordance with the thrust instruction value F4 defined in the equation (11) above, then feedback control is achieved such that the base plate 101 neither tilts nor undergoes torsion. Furthermore, similar to the case of the thrust instruction value F2 discussed above, the air spring pressure instruction values that are applied to the mounts 4A-4D to generate thrusts in accordance with the abovementioned thrust instruction value F4 can be defined so that $P_{4A}=F_{4A}/a_A$, $P_{4B}=F_{4B}/a_B$, $P_{4C}=F_{4C}/a_C$, and $P_{4D}=F_{4D}/a_D$.

The following explains the calculating method wherein the base plate torsion correcting unit 19 calculates the thrust instruction value F5. If the base plate 101 is subject to the torsion $Z_T$ defined by equation (12) below, then the base plate torsion correcting unit 19 performs control, causing the mounts 4A-4D to generate thrusts that correct this torsion. Namely, it is possible to use a technique, such as typical PID control, to derive the torsional force ΔF that zero the differential between the torsion $Z_T$ of the base plate 101, which was calculated using equation (12) below based on the position of each of the mounts 4A-4D in the Z directions as measured by the position sensors, and the target reference value $Z_{T0}$ (=0). The mounts 4A, 4B, 4C, 4D generate thrusts $F_{5A}$, $F_{5B}$, $F_{5C}$, $F_{5D}$, respectively—equation (13) below is equivalent to the second term on the right side of equation (11), also below—according to the thrust instruction value F5 as defined by equation (13) below so that the derived torsional force ΔF acts on the base plate 101.

Equation 12

$$Z_T = \frac{1}{2}(Z_A + Z_C) - \frac{1}{2}(Z_B + Z_D) \quad (12)$$

Equation 13

$$\begin{bmatrix} F_{5A} \\ F_{5B} \\ F_{5C} \\ F_{5D} \end{bmatrix} = \begin{bmatrix} \frac{1}{4} \\ -\frac{1}{4} \\ \frac{1}{4} \\ -\frac{1}{4} \end{bmatrix} \Delta F \quad (13)$$

Furthermore, if the servo operator of the torsion $Z_T$ is defined as servo $(Z_T)$, then the equation that derives the torsional force ΔF based on the differential between $Z_T$ and $Z_{T0}$ is ΔF=$-Z_T$·servo($Z_T$). In addition, similar to the case of the thrust instruction value F2 discussed above, the air spring pressure instruction values applied to the mounts 4A-4D in order to generate the thrusts according to the abovementioned thrust instruction value F5 can be defined so that $P_{5A}=F_{5A}/a_A$, $P_{5B}=F_{5B}/a_B$, $P_{5C}=F_{5C}/a_C$, and $P_{5D}=F_{5D}/a_D$.

Figure 5:
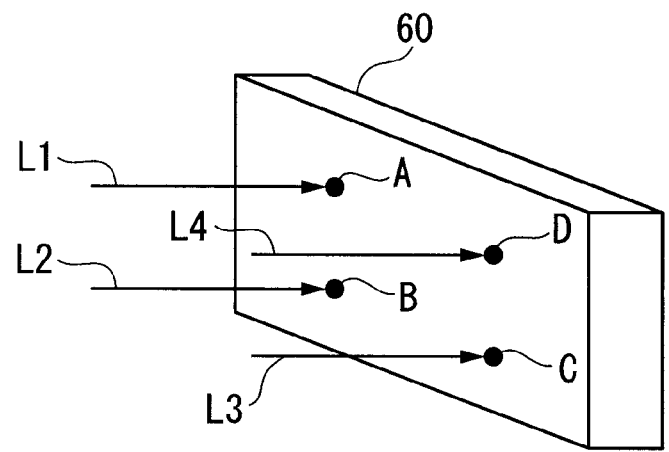
FIG. 5 is a view that shows a lens that is mounted to a base plate.

The following explains the calculating method wherein the lens torsion correcting unit 14 calculates the thrust instruction value F3. FIG. 5 is a view that shows a lens 60 that is mounted to the base plate 101 via a prescribed support mechanism (not shown). Laser beams L1-L4 from laser interferometers are reflected at four points A, B, C, D on the lens 60 and the positions a, b, c, d of the four points A-D are measured by interferometric measurement wherein those reflected beams are used. Here, the torsion of the lens 60 is defined by L=(a+c)−(b+d). When the lens 60 undergoes torsion L, the torsional force ΔF is applied to the base plate 101 to cancel the torsion L. A proportional relationship (with a proportional constant of a) exists between the torsional force ΔF and the torsion L of the lens 60, and therefore the lens torsion correcting unit 14 causes the mounts 4A, 4B, 4C, 4D to generate thrusts $F_{3A}$, $F_{3B}$, $F_{3C}$, $F_{3D}$, respectively, in accordance with the thrust instruction value F3 as defined by equation (14) below; thereby, control that cancels the torsion L, which arises in the lens 60, is achieved.

Equation 14

$$\begin{bmatrix} F_{3A} \\ F_{3B} \\ F_{3C} \\ F_{3D} \end{bmatrix} = \begin{bmatrix} \frac{1}{4} \\ -\frac{1}{4} \\ \frac{1}{4} \\ -\frac{1}{4} \end{bmatrix} \Delta F = \begin{bmatrix} -\frac{a \cdot L}{4} \\ \frac{a \cdot L}{4} \\ -\frac{a \cdot L}{4} \\ \frac{a \cdot L}{4} \end{bmatrix} \quad (14)$$

Furthermore, similar to the case of the thrust instruction value F2 discussed above, the air spring pressure instruction values that are applied to the mounts 4A-4D in order to generate thrusts in accordance with the abovementioned thrust instruction value F3 can be defined so that $P_{3A}=F_{3A}/a_A$, $P_{3B}=F_{3B}/a_B$, $P_{3C}=F_{3C}/a_C$, and $P_{3D}=F_{3D}/a_D$.

The above text explained an embodiment of the present invention based on the drawings, but the specific constitution of the invention is not limited to these embodiments, and it is understood that variations and modifications may be effected without departing from the spirit and scope of the invention.

The thrust that is generated by each of the mounts 4A-4D is not necessarily controlled in accordance with a total thrust instruction value, which is the sum of the following: the thrust instruction value F1, calculated by the acceleration state-based thrust calculating unit 12; the thrust instruction value F2, calculated by the movement position-based thrust calculating unit 13; the thrust instruction value F3, calculated by the lens torsion correcting unit 14; the thrust instruction value F4, calculated by the thrust feedback control unit 16; and the thrust instruction value F5, calculated by the base plate torsion correcting unit 19; for example, the thrusts of the mounts 4A-4D may be controlled in accordance with all or some combination of the F1, F2, F3, F4, F5.

Figure 6:
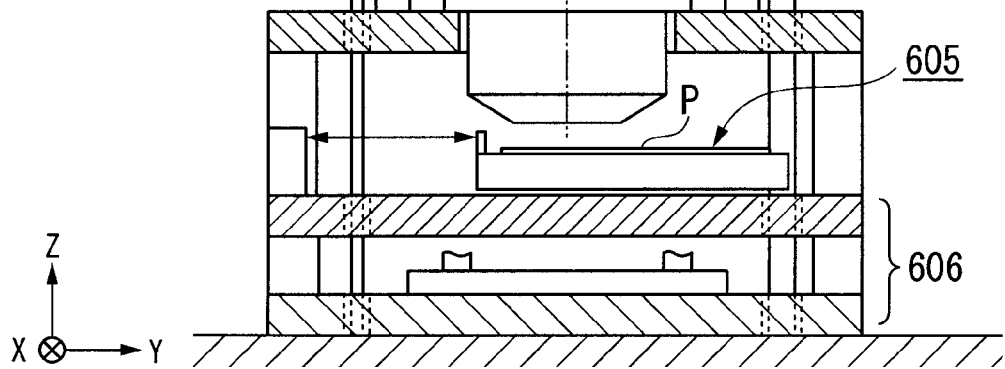
FIG. 6 is a block diagram of an exposure apparatus whereto the damping apparatus and the stage apparatus are adapted.

In addition, the damping apparatus and the stage apparatus, according to the embodiments discussed above, can be adapted to an exposure apparatus that prints a fine circuit pattern on, for example, a glass substrate or a semiconductor substrate. FIG. 6 is a block diagram of the exposure apparatus whereto the damping apparatus and the stage apparatus discussed above are adapted. An exposure apparatus 601 comprises the following: an illumination optical system 602; a mask stage apparatus 603, which holds and moves a mask M; a projection optical system PL; a substrate stage apparatus 605, which holds and moves a glass substrate P; and a damping apparatus 606.

The illumination optical system 602 comprises a light source unit, a shutter, an optical system for forming a two dimensional light source, a beam splitter, a condenser lens system, a reticle blind, and an imaging lens system, none of which are shown; furthermore, the illumination optical system 602 illuminates a prescribed illumination area (which includes the circuit pattern) on the mask M, which is held by the mask stage apparatus 603, with illumination light IL of a uniform luminous flux intensity.

The projection optical system PL is an optical system (e.g., a dioptric system) that has multiple lens elements disposed along the directions of an optical axis AX at prescribed spacings; furthermore, when the illumination area of the mask M is illuminated with the illumination light IL from the illumination optical system 602, the illumination light that transmits through the mask M is used to project an erect image (with a prescribed magnification) of the circuit pattern in the illumination area of the mask M through the projection optical system PL and onto the glass substrate P, thereby exposing photoresist that is coded on the front surface of the glass substrate P.

The substrate stage apparatus 605 is installed so that it is supported by the damping apparatus 606, which performs the control discussed above. Furthermore, a configuration may be adopted so that the mask stage apparatus 603 is supported by the damping apparatus 606.

What is claimed is:

1. An assembly comprising:
   a stage apparatus that includes a first stage, a second stage, a first motor that moves the first stage and the second stage along an X axis, and a second motor that moves the second stage along a Y axis that is orthogonal to the X axis;
   a base plate that supports the stage apparatus;
   a first mount, a second mount, a third mount and a fourth mount that are spaced apart and that cooperate to support the base plate in a vertical direction; and
   a control system that controls the first, second, third, and fourth mounts, the control system includes a thrust calculating unit that utilizes an equation as provided below to calculate at least a portion of a thrust value for the first mount:

$$F_A = \frac{W}{4} - \frac{W}{2L_X}X - \frac{W_Y}{2L_Y}Y + \frac{W_Y}{L_X L_Y}XY$$

where (i) $F_A$ is a thrust value for the first mount; (ii) W is a force that the first stage and the second stage exert upon the base plate as a result of gravity; (iii) $W_Y$ is a force that the second stage alone exerts on the base plate as a result of gravity; (iv) X is a position of a center of gravity of the second stage along the X axis, (v) Y is a position of the center of gravity of the second stage along the Y axis, (vii) $L_X$ is a distance between the first mount and the second mount in an X direction, and (viii) $L_Y$ is a distance between the first mount and the third mount in a Y direction.

2. The assembly of claim 1 wherein, the thrust calculating unit utilizes the following equation to calculate at least a portion of a thrust value for the second mount:

$$F_B = \frac{W}{4} + \frac{W}{2L_X}X - \frac{W_Y}{2L_Y}Y - \frac{W_Y}{L_X L_Y}XY$$

where $F_B$ is the thrust value for the second mount.

3. The assembly of claim 2 wherein, the thrust calculating unit utilizes the following equation to calculate at least a portion of a thrust value for the third mount:

$$F_C = \frac{W}{4} + \frac{W}{2L_X}X + \frac{W_Y}{2L_Y}Y + \frac{W_Y}{L_X L_Y}XY$$

where $F_C$ is the thrust value for the third mount.

4. The assembly of claim 3 wherein, the thrust calculating unit utilizes the following equation to calculate at least a portion of a thrust value for the fourth mount:

$$F_D = \frac{W}{4} - \frac{W}{2L_X}X + \frac{W_Y}{2L_Y}Y - \frac{W_Y}{L_X L_Y}XY$$

where $F_D$ is the thrust value for the fourth mount.

5. The apparatus of claim 1 wherein the control system controls the first, second, third, and fourth mounts so that torsional deformation is inhibited in the base plate.

6. The apparatus of claim 1 further comprising a first position detector that detects a position of the base plate in the vertical direction at a plurality of locations, and wherein the control system controls the first, second, third, and fourth mounts based on the position at a plurality of locations as detected by the first position detector.

7. The apparatus of claim 1 wherein the control system controls the first, second, third, and fourth mounts based on an acceleration of the stages so as to compensate for forces that occur as a result of the acceleration of the stages and cause the support plate part to tilt.

8. The apparatus of claim 1 wherein at least one of the first, second, third, and fourth mounts is an air spring type support mechanism.

9. The apparatus of claim 1 further comprising a lens that is supported by the base plane, and wherein the control system controls the first, second, third, and fourth mounts to correct for torsion in the lens.

10. An exposure apparatus that exposes a photosensitive substrate, the exposure apparatus comprising an illumination optical system and the assembly of claim 1 with the second stage retaining the substrate, and the second motor moving the substrate relative to the illumination optical system.

11. An assembly comprising:
    a stage apparatus that includes a first stage, a second stage, a first motor that moves the first stage along an X axis, and a second motor that moves the second stage along a Y axis that is orthogonal to the X axis;
    a base plate that supports the stage apparatus;
    a first mount, a second mount, a third mount and a fourth mount that are spaced apart and that cooperate to support the base plate in a vertical direction; and
    a control system that controls the first, second, third, and fourth mounts, the control system includes a thrust calculating unit that utilizes a term as provided below to calculate at least a portion of a thrust value for the first mount;

$$\frac{W_Y}{L_X L_Y}XY$$

where (i) $W_Y$ is a force that the second stage alone exerts on the base plate as a result of gravity; (ii) X is a position of a center of gravity of the second stage along the X axis, (iii) Y is a position of the center of gravity of the second stage along the Y axis, (iv) $L_X$ is a distance between the first mount and the second mount in an X direction, and (v) $L_Y$ is a distance between first mount and the third mount in a Y direction.

12. The assembly of claim 11 wherein, the thrust calculating unit utilizes the term $$\frac{W_Y}{L_X L_Y} XY$$

to calculate at least a portion of a thrust value for the second mount, at least a portion of a thrust value for the third mount, and at least a portion of a thrust value for the fourth mount.

13. The apparatus of claim 11 wherein the control system controls the first, second, third, and fourth mounts so that torsional deformation is inhibited in the base plate.

14. The apparatus of claim 11 further comprising a first position detector that detects the position of the base plate in the vertical direction at a plurality of locations, and wherein the control system controls the first, second, third, and fourth mounts based on the position at a plurality of locations as detected by the first position detector.

15. The apparatus of claim 11 wherein the control system controls the first, second, third, and fourth mounts based on an acceleration of the stages so as to compensate for forces that occur as a result of the acceleration of the stages and cause the support plate part to tilt.

16. The apparatus of claim 11 wherein at least one of the first, second, third, and fourth mounts is an air spring type support mechanism.

17. The apparatus of claim 11 further comprising a lens that is supported by the base plate, and wherein the control system controls the first, second, third, and fourth mounts to correct for torsion in the lens.

18. An exposure apparatus that exposes a photosensitive substrate, the exposure apparatus comprising an illumination optical system and the assembly of claim 11 with the second stage retaining the substrate, and the second motor moving the substrate relative to the illumination optical system.

* * * * *